United States Patent [19]

Shim

[11] Patent Number: 5,641,946

[45] Date of Patent: Jun. 24, 1997

[54] METHOD AND CIRCUIT BOARD STRUCTURE FOR LEVELING SOLDER BALLS IN BALL GRID ARRAY SEMICONDUCTOR PACKAGES

[75] Inventor: Il Kwon Shim, Seoul, Rep. of Korea

[73] Assignees: Anam Industrial Co., Ltd., Seoul, Rep. of Korea; Amkor Electronics, Inc., Chandler, Ariz.

[21] Appl. No.: 588,482

[22] Filed: Jan. 18, 1996

[30] Foreign Application Priority Data

Jul. 5, 1995 [KR] Rep. of Korea ............... 95-19581

[51] Int. Cl.$^6$ ............................................. H05K 1/02
[52] U.S. Cl. ..................... 174/261; 174/260; 361/767; 361/768; 257/738
[58] Field of Search ........................ 174/260, 261; 361/767, 768, 760; 228/180.22, 180.21; 29/840, 832; 257/737, 738

[56] References Cited

U.S. PATENT DOCUMENTS

| | | | |
|---|---|---|---|
| 3,871,014 | 3/1975 | King et al. | 357/67 |
| 4,581,680 | 4/1986 | Garner | 361/403 |
| 4,604,644 | 8/1986 | Beckham et al. | 357/80 |
| 4,755,631 | 7/1988 | Churchwell et al. | 174/68.5 |
| 5,315,485 | 5/1994 | Magill et al. | 361/767 |
| 5,381,307 | 1/1995 | Hertz et al. | 361/767 |
| 5,484,963 | 1/1996 | Washino | 174/261 |
| 5,539,153 | 7/1996 | Schweibert et al. | 174/260 |

*Primary Examiner*—Laura Thomas
*Attorney, Agent, or Firm*—Skjerven, Morrill, MacPherson, Franklin, & Friel; Thomas S. MacDonald

[57] ABSTRACT

Method and circuit board structure for leveling the tops of solder balls of a BGA semiconductor package is disclosed. In order to level the solder balls, the sizes of solder ball lands used for welding the solder balls to the circuit board are controlled in accordance with portions of the circuit board. The invention thus achieves the coplanarity of the solder balls regardless of thermal bending of the plastic body and circuit board of the BGA semiconductor package. In an embodiment, a plurality of solder ball lands having different sizes are formed on the circuit board prior to forming the solder balls on the lands. In another embodiment, a plurality of solder ball lands having the same size are formed on the circuit board prior to forming an insulating mask on the circuit board in order to form differently-sized exposed inside portions of solder ball lands.

20 Claims, 6 Drawing Sheets

METHOD AND CIRCUIT BOARD STRUCTURE FOR LEVELING SOLDER BALLS IN BALL GRID ARRAY SEMICONDUCTOR PACKAGES

BACKGROUND OF THE INVENTION

1. Field of the Invention

The present invention relates in general to a method and circuit board structure for leveling solder balls in BGA (ball grid array) semiconductor packages with solder ball input and output terminals. More particularly, the present invention relates to an improved method and circuit board structure for improving coplanarity of a BGA package's solder ball array caused by thermal bending of the circuit board generated during a high temperature processing step of a BGA semiconductor package producing process.

2. Description of the Prior Art

In recent years, several types of BGA (ball grid array) semiconductor packages with solder ball input and output terminals, for example, cavity BGA packages, die down BGA packages and tape BGA packages have been proposed and used as new semiconductor packages. In the typical BGA semiconductor packages, PCBs (printed circuit boards) and polyimide tapes are generally used as the circuit boards of the packages. However, the BGA package's parts such as the above circuit boards are apt to be applied with and affected by the thermal stress during high temperature steps (performed under the condition of a temperature not lower than 150° C.) of a semiconductor package producing process. FIGS. 1A to 1D show examples of bad coplanarity of the solder ball array as a result of thermal bending of a typical BGA semiconductor package. As shown in the drawings, the typical BGA package is bent when the package is applied with the thermal stress during a high temperature step of the package producing process. This is due to different thermal expansion coefficients of the PCB 1 and plastic body 2. As the typical BGA packages have been generally molded by a one-side molding method in which only one side of the package is molded, the thermal bending of the package becomes worse. The array of solder balls 3 welded to the PCB 1 is bent by the thermal bending of the PCB 1. The solder ball array thus has bad coplanarity. When the coplanarity of the solder ball array is lower than a predetermined level, a part of solder balls 3 fails to come into contact with a mother board not shown when the package is mounted to the mother board. For example, when the BGA package is thermally bent to cause the top center of the package to be concaved as shown in FIG. 2A, the solder balls 3 welded to both end portions of the PCB 1 fail to come into contact with the mother board when mounting the package to the mother board. On the other hand, when the BGA package is thermally bent to cause the top center of the package to be convexed as shown in FIG. 2B, the solder balls 3 welded to the center portion of the PCB 1 fail to come into contact with the mother board. When a part of the solder balls 3 is not brought into contact with the mother board due to the thermal bending as described above, the package fails to perform its operational function.

Figure 3:
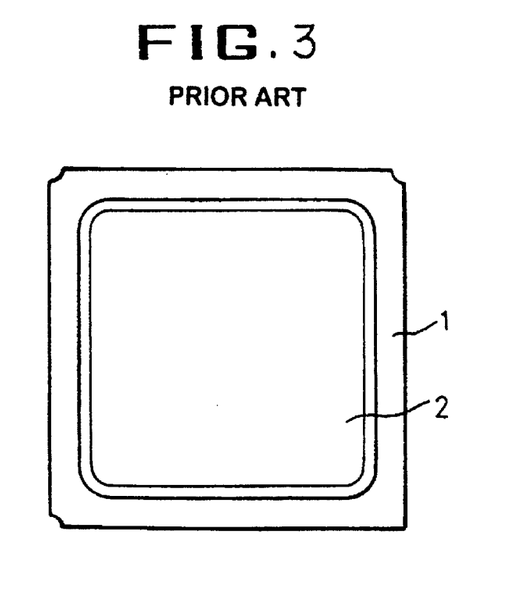
FIGS. 3 and 4 are plan and side views of a BGA semiconductor package, showing a typical method for preventing the thermal bending of the BGA semiconductor package.
Figure 4:
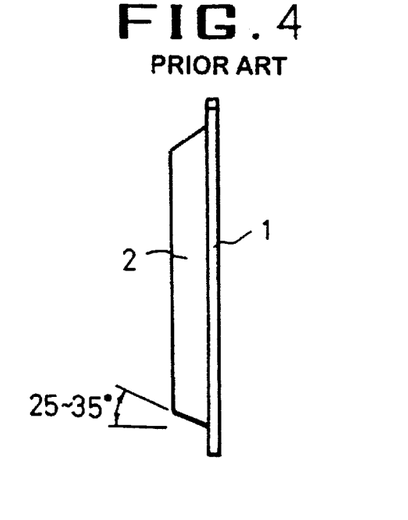

In an effort to prevent the above thermal bending of the plastic body and PCB of the BGA package, the configuration of the plastic body 2 is changed from the typical square or rectangular configuration into another configuration capable of effectively resisting the thermal stress. For example, the corners of the plastic body 2 may be smoothly rounded. In addition, the slope angle Θ of the sides of the plastic body 2 increases from 7°–12° degree to 25°–35° degree as shown in FIGS. 3 and 4, thus reducing the stress of the body's sides and minimizing the thermal bending of the PCB 1 and body 2.

However, the above method for preventing the thermal bending of the body and PCB is not for improving the ratio of contact of the solder balls, but for protecting the semiconductor chip and preventing cracks in the package's parts. In this regard, the above method somewhat prevents the thermal bending of the plastic body but fails to prevent the thermal bending of the PCB when the package is thermally bent as shown in FIGS. 1C, 1D and 2B.

SUMMARY OF THE INVENTION

It is, therefore, an object of the present invention to level the tops of the solder balls, which will be brought into contact with a mother board when a BGA semiconductor package is mounted to the mother board, by adjusting the size of solder ball lands used for welding the solder balls to the PCB, thereby achieving the coplanarity of the solder balls regardless of thermal bending of the plastic body and PCB of the BGA semiconductor package.

In order to accomplish the above object, the present invention levels the tops of the solder balls by either designing solder ball lands having different sizes or forming differently-sized exposed inside portions of solder ball lands using a mask after forming the solder ball lands of the same size on the PCB.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE INVENTION

The diameters and heights of solder balls were measured after the solder balls were formed on solder ball lands and subjected to reflow. The measured diameters and heights of the solder balls are given in the following Table.

TABLE (the diameters and heights of solder balls changing according to the diameters of the solder ball lands)

| diameter of original solder ball | solder ball land (diameter, mm) | after reflow | |
|---|---|---|---|
| | | diameter (mm) | height (mm) |
| 0.76+/−0.025 mm (30 ± 1 Mil) | 0.636 (ave.) | ave.* = 0.807 min. = 0.794 max. = 0.817 | ave. = 0.588 min.* = 0.571 max.* = 0.622 ref.* = 0.017 max. − min. = 0.051(2.0Mil) |
| | 0.605 (ave.) | ave. = 0.796 min. = 0.782 max. = 0.807 | ave. = 0.600 max. = 0.620 max. − min. = 0.052(2.0Mil) | ave.* = average
min.* = minimum
max.* = maximum
ref.* = reference height

The above Table shows how the diameter and height of original solder balls changed after the original solder balls having a diameter of 0.76 mm were seated on solder ball lands having different diameters and were subjected to reflow. The above Table shows that when the diameter of a solder ball land was 0.636 mm, the diameter of the solder ball formed on the solder ball land was enlarged to an average diameter of 0.807 mm, thus increasing by about 6.1%.

The diameter of the solder ball land is in linear reverse proportion to the height of the resulting solder ball. When the diameter of the solder ball land is larger or smaller than the diameters shown in the above Table, the linear reverse proportional relation between the solder ball land's diameter and resulting solder ball's height is maintained.

When the diameter of the solder ball land was 0.605 mm, the diameter of the solder ball seated on the solder ball land was enlarged to an average diameter of 0.796 mm, thus increasing by about 4.7%. That is, it is noted that the diameters of the solder balls after the reflow are increased in proportion to the diameters of the solder ball lands on which the solder balls are formed.

In order to compensate for the bad coplanarity of solder ball array caused by the thermal bending of the circuit board of the BGA semiconductor package, it is important to appropriately adjust the heights of the resulting solder balls. When the diameter of the solder ball land was 0.636 mm, the height of the solder ball after reflow was changed into an average height of 0.588 mm, thus reducing by 29.2%. Meanwhile, when the diameter of the solder ball land was 0.605 mm, the height of the solder ball after reflow was changed into an average height of 0.600 mm, thus reducing by 26.6%.

The present invention adjusts the height of the solder balls on the basis of the above experimental results thereby compensating for the bad coplanarity of solder ball array caused by the thermal bending of the circuit board of a BGA semiconductor package.

Figure 5A:
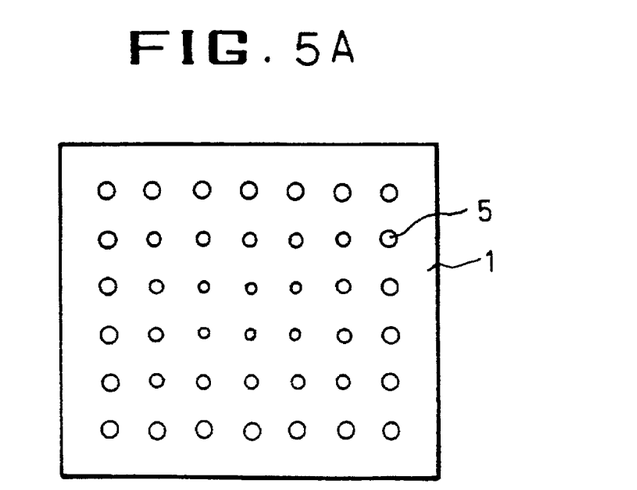
FIGS. 5A and 5B are views showing an example of solder ball lands of a circuit board designed in accordance with the present invention in order to compensate for bad coplanarity of a BGA package's solder ball array due to a convexed thermal bending of the circuit board.
Figure 5B:
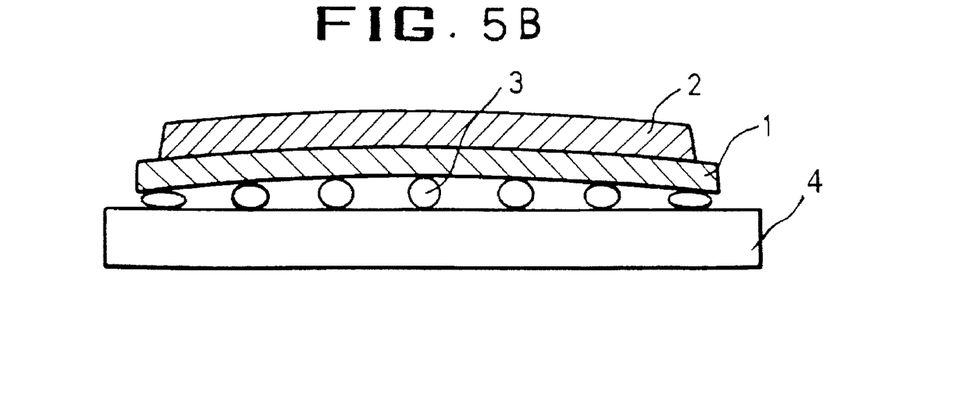

FIGS. 5A and 5B show examples of designing the solder ball lands of a BGA semiconductor package in accordance with the present invention. As shown in the drawings, the solder ball lands 5 are formed on the circuit board 1 of the BGA package. A solder ball is formed on each solder ball land and is welded to the circuit board 1. In the present invention, the solder ball lands 5 are preferably formed of a metal such as gold (Au), nickel (Ni) and copper (Cu). The above solder ball lands 5 have different sizes depending on the thermally bent configuration and bending angle of the circuit board 1 of the package.

Figure 1A:
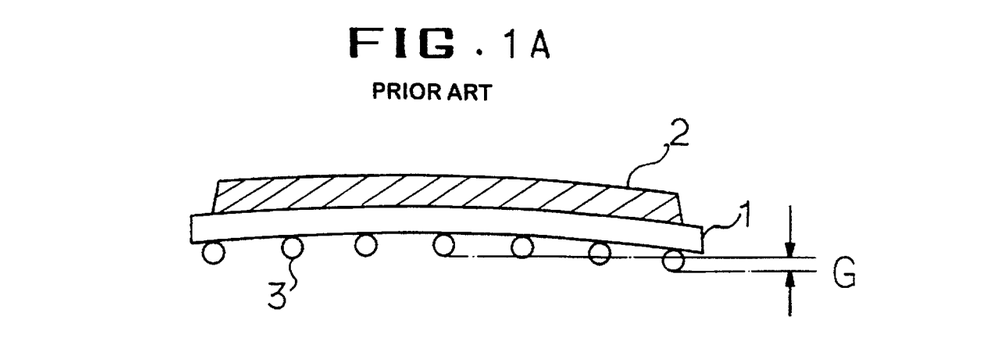
FIGS. 1A to 1D are sectional views showing examples of bad coplanarity of a package's solder ball array as a result of thermal bending of a typical BGA semiconductor package.
Figure 2A:
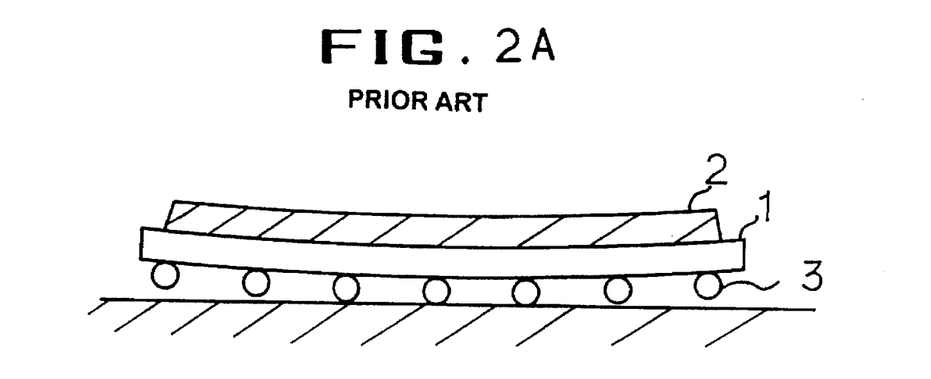
FIGS. 2A and 2B are sectional views showing a bad contact of the solder balls of thermally bent BGA packages when the packages are mounted mother boards.
Figure 2B:
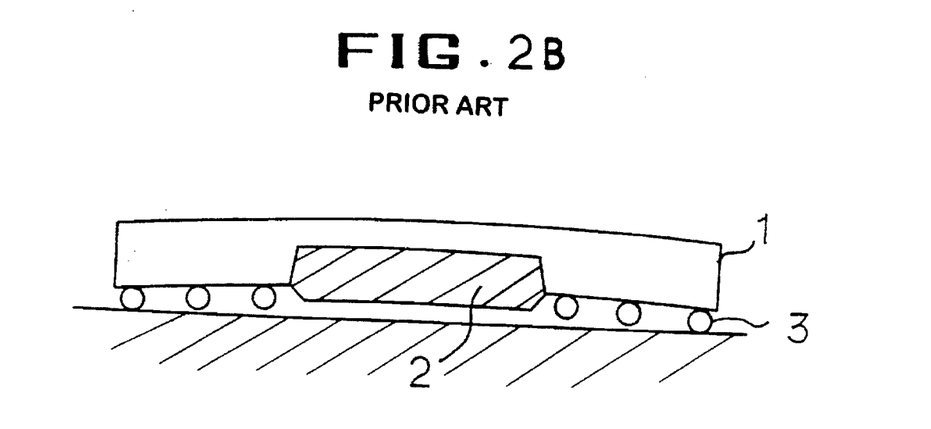

When the BGA semiconductor package is thermally bent causing the top center of the package to be convexed thereby causing bad coplanarity of the solder ball array as shown in FIG. 1A, the solder ball lands 5 are designed as follows. The outside lands 5 are designed to be larger than the inside lands 5 as shown in FIG. 5A. FIG. 5B is a sectional view of the BGA semiconductor package which has the solder balls welded to the solder ball lands 5 of FIG. 5A and is mounted to a mother board 4.

Figure 1B:
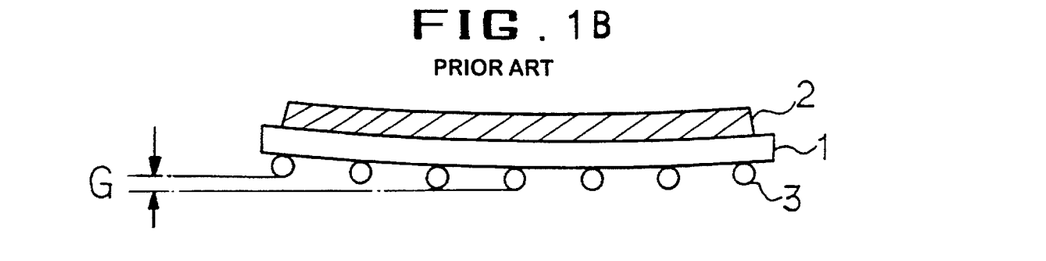
Figure 1C:
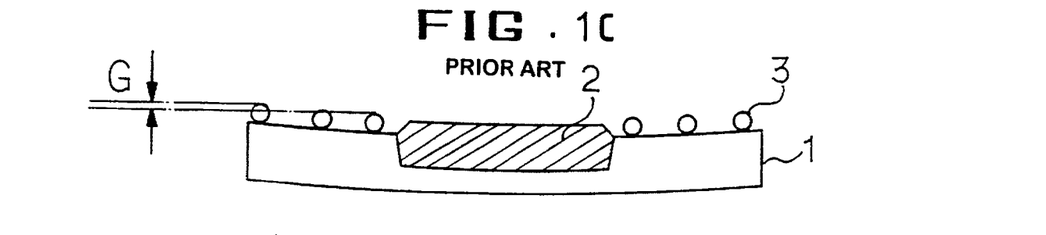
Figure 1D:
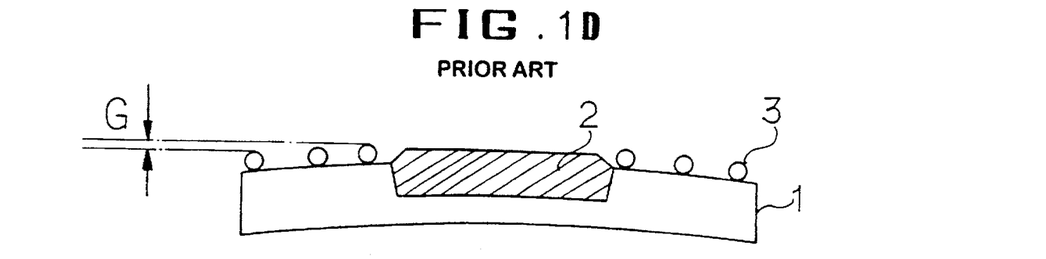
Figure 6:
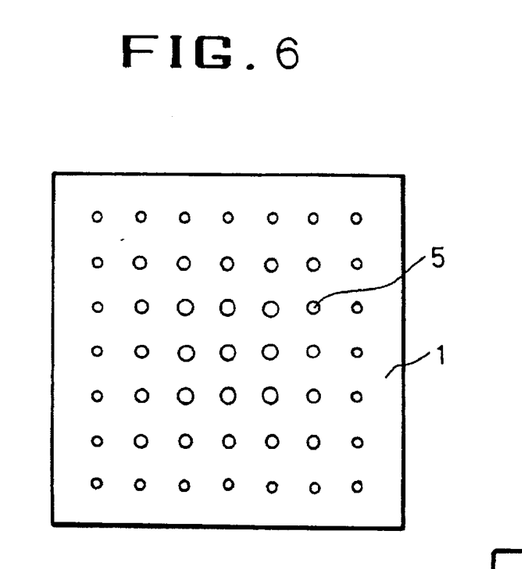
FIG. 6 is a view showing another example of solder ball lands of the circuit board designed in accordance with the present invention in order to compensate for bad coplanarity of the package's solder ball array due to a concaved thermal bending of the circuit board.

Meanwhile, when the package is thermally bent causing the top center of the package to be concaved thereby causing bad coplanarity of the solder ball array as shown in FIG. 1B, the outside lands 5 are designed to be smaller than the inside lands 5 as shown in FIG. 6. The configuration of the solder ball lands of FIG. 6 compensates for the bad coplanarity of the solder ball array.

Figure 7:
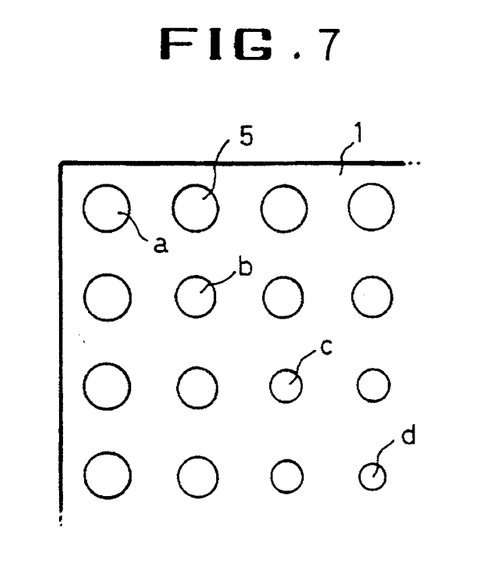
FIG. 7 is a partially enlarged view showing the solder ball lands of FIG. 5A.
Figure 8:
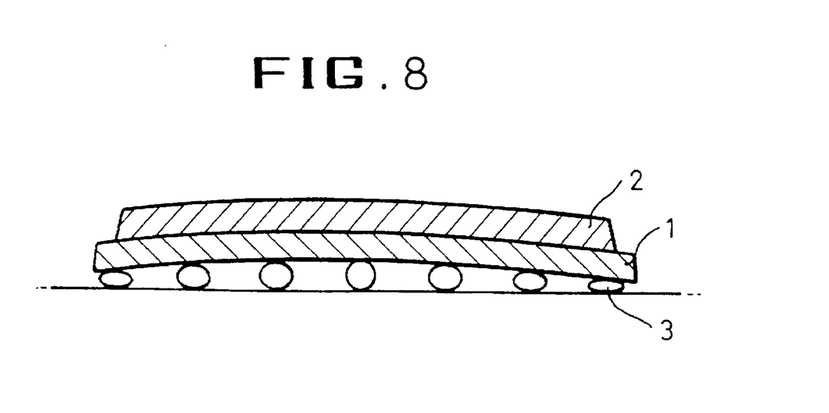
FIG. 8 is a sectional view of a BGA semiconductor package mounted on a mother board, showing the solder ball array's coplanarity compensated by the circuit board structure of the present invention.

FIG. 7 is a partially enlarged view of the circuit board 1 of FIG. 5A. The circuit board 1 of FIG. 7 is thermally bent causing the top center of the board 1 to be convexed as described for the circuit board of FIG. 5A. In the above circuit board 1, the size of the solder ball lands 5 is gradually reduced in such a manner that the outermost solder ball land "a" has the largest size, while the innermost land "d" has the smallest size. In the circuit board 1 of FIG. 5A, the height of the solder ball 3 welded to the outermost land "a" is significantly reduced by the reflow as represented in the above Table. That is, the height of the solder balls 3 welded to the lands 5 is gradually changed in such a manner that the solder ball 3 welded to the innermost land "d" is highest, while the solder ball 3 welded to the outermost land "a" is lowest as shown in FIG. 8. Therefore, it is possible to compensate for the bad coplanarity of the solder ball array caused by the thermal bending of the circuit board 1 of FIG. 1A.

In the present invention, the solder ball landing area suitable for compensating for the bad coplanarity of the solder ball array due to thermal bending of the circuit board 1 may be formed by either of the following two methods.

In a first method for forming the solder ball landing area suitable for compensating for the bad coplanarity of the solder ball array, a plurality of solder ball lands having different sizes are primarily formed on the circuit board 1 by etching the metal part of the circuit board 1. After forming the above solder ball lands, a solder mask is formed on the area of the circuit board 1 except for portions with the solder ball lands 5. Thereafter, a plurality of solder balls 3 are formed on the solder ball lands 5 in the above state.

Figure 9A:
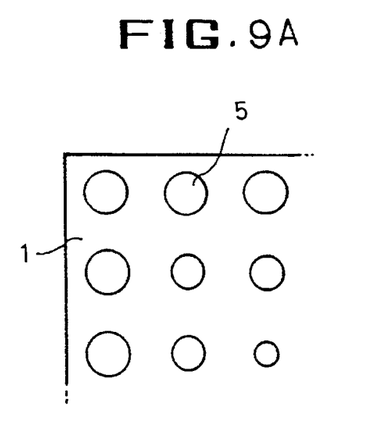
FIGS. 9A and 9B are views showing solder ball lands of the circuit board designed in accordance with a primary embodiment of the present invention in order to compensate for bad coplanarity of the BGA package's solder ball array due to a convexed thermal bending of-the circuit board.
Figure 9B:
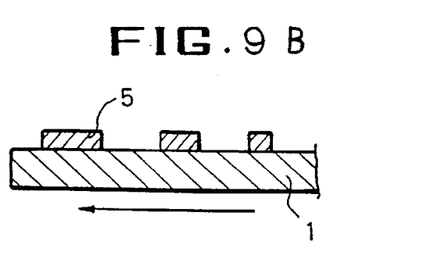
Figure 10A:
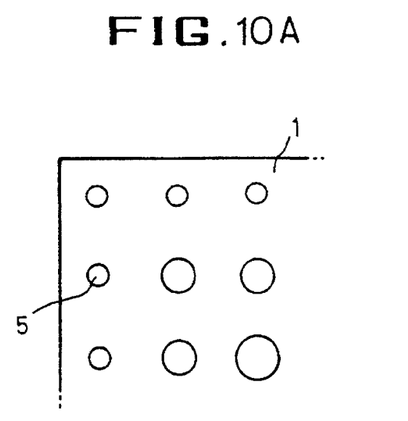
FIGS. 10A and 10B are views showing solder ball lands of the circuit board designed in accordance with the primary embodiment of the present invention in order to compensate for bad coplanarity of the BGA package's solder ball array due to a concaved thermal bending of the circuit board.
Figure 10B:
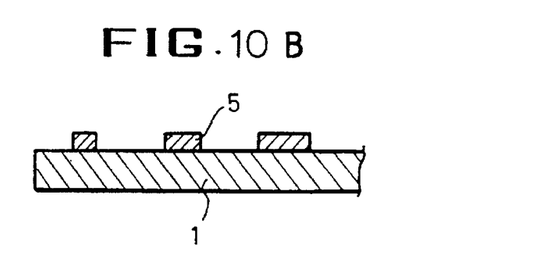

That is, the solder ball lands 5 are formed on the circuit board 1 as shown in FIGS. 9A, 9B, 10A and 10B. In this case, the sizes of the solder ball lands 5 are different from each other in accordance with the thermally bent configuration and bending angle of the circuit board 1. That is, the solder ball lands 5 may be designed in such a manner that the outermost land 5 is larger or smaller than the innermost land 5. In the event of a circuit board 1 which is thermally bent causing its top center to be convexed as shown in FIG. 1A, the solder ball lands 5 of the circuit board 1 are designed to be gradually larger in the direction from the innermost land to the outermost land as shown in the arrow of FIG. 9B. That is, the outermost land of the circuit board 1 in the above case has the largest size, while the innermost land has the smallest size. Meanwhile, in the event of a circuit board 1 which is thermally bent causing its top center to be concaved as shown in FIG. 1B, the solder ball lands 5 are designed to be gradually enlarged in the direction from the outermost land to the innermost land as shown in FIGS. 10A and 10B. That is, the outermost land in the above case has the smallest size while the innermost land has the largest size.

Figure 11:
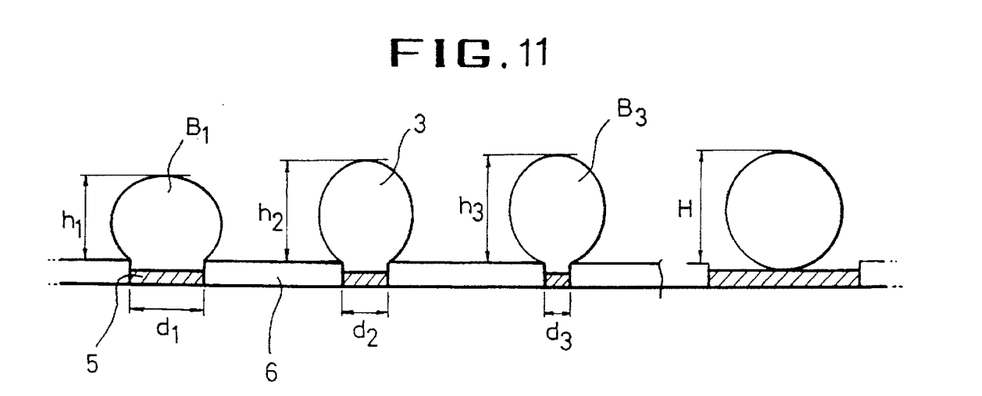
FIG. 11 is a view showing the configurations of a plurality of solder balls formed on the solder ball lands designed in accordance with the primary embodiment of the present invention.

FIG. 11 shows the solder balls 3 which are seated on the above solder ball lands 5 and subjected to the reflow. When a solder ball $B_1$ is formed on the largest solder ball land 5 having the largest diameter $d_1$, the solder ball $B_1$ is largely deformed as the solder ball $B_1$ on the largest land 5. In this regard, the height of the solder ball $B_1$ is significantly reduced from the original height H to the final height $h_1$. That is, it is noted that the solder ball $B_1$ formed on the largest solder ball land 5 becomes the lowest solder ball.

On the other hand, when a solder ball $B_3$ is formed on the smallest solder ball land 5 having the smallest diameter $d_3$, the solder ball $B_3$ is scarcely deformed as the solder ball $B_3$ on the smallest land 5 has the smallest welding area. In this regard, the height of the solder ball $B_3$ is scarcely reduced from the original height H to the final height $h_3$. That is, it is noted that the solder ball $B_3$ formed on the smallest solder ball land 5 becomes the highest solder ball.

As described above, the bad coplanarity of the solder ball array of a BGA semiconductor package due to the thermal bending of the circuit board 1 can be compensated for by forming the solder ball lands 5 which have different diameters in accordance with portions of the thermally bent circuit board 1. With the different sizes of the solder ball lands 5, the height of the solder balls 3 formed on the solder ball lands 5 can be adjusted in order to bring all of the solder balls 3 into uniform contact with a mother board when the BGA package is mounted to the mother board.

The second method for forming the solder ball landing area suitable for compensating for the bad coplanarity of the solder ball array is shown in FIGS. 12A, 12B, 13A and 13B. In the above second method, a plurality of solder ball lands 5 having the same size are primarily formed on the circuit board 1 by etching the metal part of the circuit board 1. After forming the solder ball lands 5 having the same size, an insulating mask 6 is formed on the circuit board 1 such that the mask covers portions with no lands and outside portions of the lands. In this case, the size of the exposed portions of the solder ball lands 5 are controlled by the insulating mask, thus forming solder ball lands having differently-sized exposed inside portions. Thereafter, a plurality of solder balls 3 are formed on the exposed portions of the solder ball lands 5 in the above state.

Figure 12A:
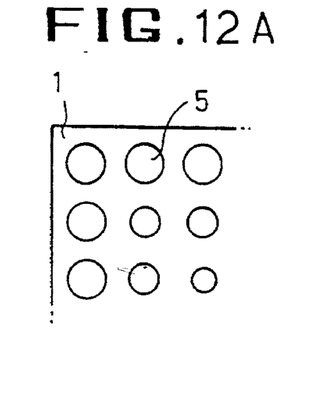
FIGS. 12A and 12B are views showing solder ball lands of the circuit board designed in accordance with a second embodiment of the present invention in order to compensate for bad coplanarity of the BGA package's solder ball array due to a convexed thermal bending of the circuit board.
Figure 12B:
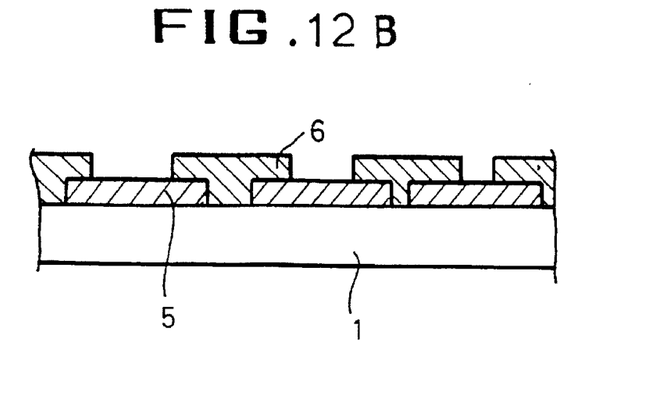

The above solder ball lands 5 are formed of a metal such as gold (Au), nickel (Ni) and copper (Cu) such that they have the same size as shown in FIG. 12B. Thereafter, the insulating mask 6 is formed on the circuit board 1. In this case, the configuration of the insulating mask 6 is changed in accordance with the bent configuration and bending angle of the circuit board 1. In the event of a circuit board 1 being thermally bent causing its top to be convex as shown in FIG. 1A, the exposed inside portions of the solder ball lands 5 are different from each other in such a manner that the outermost solder ball land 5 has the largest exposed inside portion, while the innermost land 5 has the smallest exposed inside portion as shown in FIG. 12A. FIG. 12B is a sectional view showing the construction of the circuit board 1 with the above solder ball lands 5 and insulating mask 6.

Figure 13A:
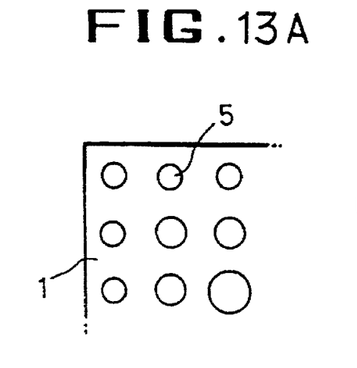
FIGS. 13A and 13B are views showing solder ball lands of the circuit board designed in accordance with the second embodiment of the present invention in order to compensate for bad coplanarity of the BGA package's solder ball array due to a concaved thermal bending of the circuit board.
Figure 13B:
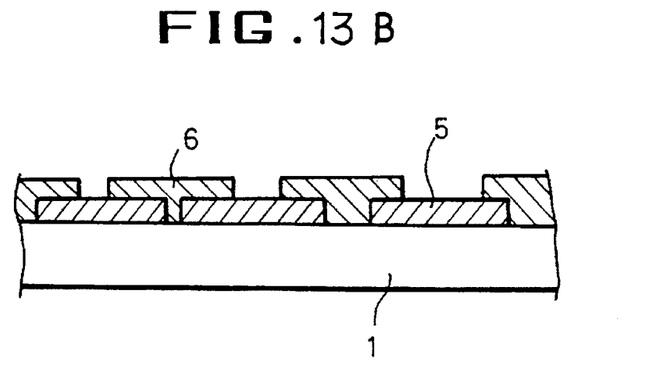

Meanwhile, when a circuit board 1 is thermally bent causing its top center to be concaved as shown in FIG. 1B, the exposed inside portions of the solder ball lands 5 are different from each other in such a manner that the outermost solder ball land 5 has the smallest exposed portion, while the innermost land 5 has the largest exposed portion as shown in FIG. 13A. FIG. 13B is a sectional view showing the construction of the circuit board 1 with the above solder ball lands 5 and insulating mask 6.

The above insulating mask 6 may be formed of a solder mask made of solder resistor ink. Alternatively, the insulating mask 6 may be formed of a polyimide tape. When a polyimide tape is used as the material of the insulating mask 6, the exposed portions of the solder ball lands 5 may be formed by etching or punching the polyimide tape.

Figure 14:
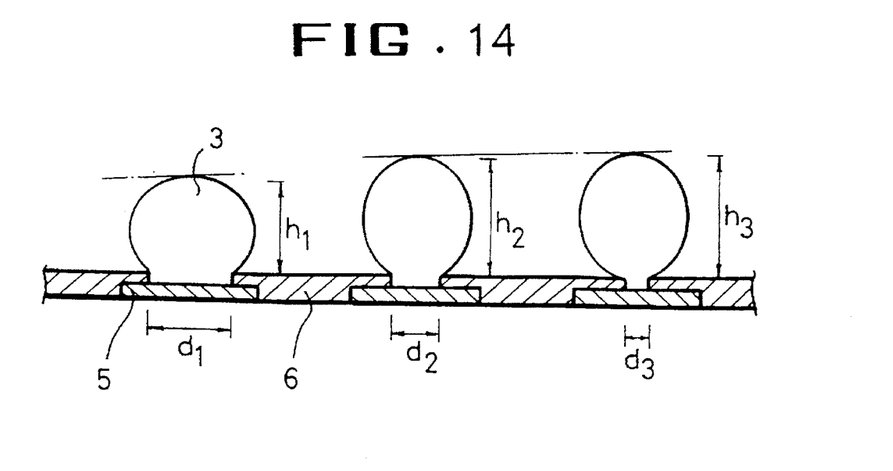
FIG. 14 is a view showing the configurations of a plurality of solder balls formed on the solder ball lands designed in accordance with the second embodiment of the present invention.

FIG. 14 show the solder balls 3 which are formed on the above solder ball lands 5. As shown in these drawings, the height of the solder balls 3 welded to the solder ball lands 5 are changed in accordance with the sizes of the exposed portions of the solder ball lands 5. That is, when a solder ball 3 is formed on the solder ball land 5 having the largest exposed part $d_1$, solder ball 3 is largely deformed as solder ball 3 has the largest welding area. In this regard, the height of solder ball 3 is largely reduced from the original height H to the final height $h_1$. On the other hand, when a solder ball 3 is formed on the solder ball land 5 having the smallest exposed part $d_3$, solder ball 3 is scarcely deformed as solder ball 3 has the smallest welding area. In this regard, the height of the above solder ball 3 is scarcely reduced from the original height H to the final height $h_3$.

As described above, it is possible to adjust the height of the solder balls by controlling the exposed area of the solder ball lands having the same size using an insulating mask, thus compensating for bad coplanarity of the solder ball array of the BGA semiconductor package caused by thermal bending of the circuit board.

In a BGA (ball grid array) semiconductor package with solder ball input and output terminals welded to a circuit board, the bad coplanarity of a solder ball array due to thermal bending of the circuit board can be compensated for by the above-mentioned two methods in accordance with the present invention. In the first method, the bad coplanarity of solder ball array is compensated for by forming a plurality of solder ball lands, which have different sizes depending on the particular location on the thermally bent circuit board, and by welding a plurality of solder balls on the above solder ball lands. In the second method, a plurality of solder ball lands having a certain size are formed on the circuit board. The solder ball lands in turn are covered with an insulating mask such that the size of the exposed area of the lands are different from each other defending on the particular location on portions of the thermally bent circuit board. In accordance with the above methods, the height of the solder balls welded to the solder ball lands is controlled to cause the tops of the solder balls to be leveled with each other. Therefore, all of the solder balls are brought into contact with the mother board irrespective of the thermal bending of the circuit board when the package is mounted to the mother board.

As described above, the present invention effectively compensates for bad coplanarity of a solder ball array of a BGA semiconductor package due to thermal bending of the circuit board. In one embodiment, a plurality of solder ball lands having different sizes are formed on the circuit board prior to forming a plurality of solder balls on the above solder ball lands, thereby compensating for the coplanarity of solder ball array. In another embodiment, a plurality of solder ball lands having the same size are formed on the circuit board. The solder ball lands in turn are covered with an insulating mask such that the exposed portions of the lands are different from each other in accordance with portions of the thermally bent circuit board. In accordance with the present invention, the height of the solder balls welded to the solder ball lands is controlled to cause the tops of the solder balls to be leveled with each other. Therefore, all of the solder balls are brought into contact with the mother board irrespective of the thermal bending of the circuit board when the package is mounted to the mother board. However, it should be understood that the bad coplanarity of the solder ball array due to thermal bending of the circuit board may be compensated by forming solder balls having different diameters on solder ball lands. In this case, the above solder balls may be formed on either solder ball lands having the same size or on the same exposed portions of the solder balls, thus becoming solder balls having different heights.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method for forming a solder ball array on a ball grid array semiconductor package, said package having a curved bent circuit board, comprising the steps of:

forming a plurality of electrically conductive solder ball lands on a surface of the circuit board, said solder ball lands having areas of graduated size, wherein the size of an area of each solder ball land depends upon the bend of the circuit board and the location of each solder ball land on the surface of said circuit board;

forming a solder mask on said circuit board, said mask having openings corresponding to the size and location of the solder ball lands;

forming a solder ball in each opening and on each of said solder ball lands; and reflowing the solder balls on the solder ball lands, and deforming said solder balls to different heights in accordance with the size of the area of the solder ball land on which each solder ball is formed.

2. A method for forming a solder ball array on a ball grid array semiconductor package, said package having a circuit board, comprising the steps of:

forming a plurality of metallic solder ball lands on a surface of the circuit board, said solder ball lands having areas of graduated size, wherein the size of an area of each solder ball land depends upon the location of each solder ball land on the surface of said circuit board;

forming a solder mask on said circuit board, said mask having openings corresponding to the size and location of the solder ball lands;

forming a solder ball in each opening and on each of said solder ball lands;

reflowing the solder balls on the solder ball lands, and deforming said solder balls to different heights in accordance with the size of the area of the solder ball land on which each solder ball is formed; and wherein the areas of different size of said solder ball lands increase gradually from a periphery of the circuit board to an inner area of the circuit board such that an outermost solder ball land has a smallest diameter, while an innermost solder ball land has a largest diameter.

3. A method for forming a solder ball array on a ball grid array semiconductor package, said package having a circuit board, comprising the steps of:

forming a plurality of metallic solder ball lands on a surface of the circuit board, said solder ball lands having areas of graduated size, wherein the size of an area of each solder ball land depends upon the location of each solder ball land on the surface of said circuit board;

forming a solder mask on said circuit board, said mask having openings corresponding to the size and location of the solder ball lands;

forming a solder ball in each opening and on each of said solder ball lands;

reflowing the solder balls on the solder ball lands, and deforming said solder balls to different heights in accordance with the size of the area of the solder ball land on which each solder ball is formed; and wherein the size of said areas of said solder ball lands increase gradually from the inner area of the circuit board to the periphery of the circuit board such that an innermost solder ball land has a smallest diameter, while an outermost solder ball land has a largest diameter.

4. The method according to claim 2 or 3, wherein the heights of the solder balls formed on said solder ball lands differ in such a manner that a solder ball formed on a larger solder ball land is lower than a solder ball formed on a smaller solder ball land.

5. A circuit board structure for improving coplanarity of a solder ball array on a ball grid array package, said package having a curved bent circuit board, comprising:

a plurality of electrically conductive solder ball lands formed on said circuit board;

a plurality of solder balls on said solder ball lands, said solder ball lands having areas of different size depending on the location of the solder ball lands on said circuit board and the bend of said circuit board;

a solder mask formed on the circuit board exposing the solder ball lands; and wherein said solder balls each having a different height depending on the size of a corresponding solder ball land and exposed ends of the solder balls are coplanar.

6. The circuit board structure for improving coplanarity of a solder ball array on a ball grid array package, said package having a circuit board, comprising:

a plurality of metallic solder ball lands formed on said circuit board;

a plurality of solder balls on said solder ball lands, said solder ball lands having areas of different size depending on the location of the solder ball lands on said circuit board;

a solder mask formed on the circuit board exposing the solder ball lands; and wherein said size of said areas of said solder ball lands formed on the circuit board increases gradually from the periphery of the circuit board to the inner area of the circuit board such that an outermost solder ball land has a smallest area, while an innermost solder ball land has a largest area.

7. The circuit board structure for improving coplanarity of a solder ball array on a ball grid array package, said package having a circuit board, comprising:

a plurality of metallic solder ball lands formed on said circuit board;

a plurality of solder balls on said solder ball lands, said solder ball lands having areas of different size depending on the location of the solder ball lands on said circuit board;

a solder mask formed on the circuit board exposing the solder ball lands; and wherein said size of said areas of said solder ball lands formed on the circuit board increases gradually from an inner area of the circuit board to a periphery of the circuit board such that an innermost solder ball land has a smallest size, while an outermost solder ball land has a largest size.

8. The circuit board structure according to claim 6 or 7, wherein said solder ball lands are formed of at least one member selected from the group consisting of gold, nickel and copper.

9. A method for forming a solder ball array in a ball grid array semiconductor package for improving coplanarity of a solder ball array of the package, said package having a circuit board, comprising the steps of:

forming a plurality of metallic solder ball lands on the circuit board;

forming an insulating mask on said circuit board, said insulating mask having a plurality of holes, each hole aligned with a solder ball land and exposing a portion of a corresponding solder ball land to form a plurality of exposed areas of said land, each of said exposed areas having a graduated size depending on the location of the lands on the circuit board;

forming a solder ball on each solder ball land; and reflowing each solder ball to a graduated height dependent on the size of the exposed area of the solder ball land.

10. The method according to claim 9, wherein said insulating mask is formed of at least one member selected from the group consisting of a solder resist ink and polyimide tape.

11. The method according to claim 9 or 10, wherein the sizes of the exposed areas of said solder ball lands increase gradually from the periphery of the circuit board to the inner area of the circuit board such that an outermost solder ball land has a smallest diameter, while an innermost solder ball land has a largest diameter.

12. The method according to claim 9 or 10, wherein the sizes of the exposed areas of said solder ball lands increases gradually from the inner area of the circuit board to the periphery of the circuit board such that an innermost solder ball land has a smallest size, while an outermost solder ball land has a largest size.

13. The method according to claim 11, wherein the heights of the solder balls formed on the exposed areas of said solder ball lands differ in such a manner that a solder ball on a solder ball land having a larger exposed area is lower than a solder ball on a solder ball land having a smaller exposed area.

14. A circuit board structure for improving coplanarity of a solder ball array on a ball grid array package, said package having a circuit board, comprising:

a plurality of metallic solder ball lands formed on the circuit board, and adapted for welding a plurality of solder balls to said circuit board; and an insulating mask formed on said circuit board, said insulating mask having a plurality of holes, each hole corresponds to a solder ball land and exposing a portion of the corresponding solder ball land to form a plurality of exposed areas, each of the exposed areas having a graduated size depending on the location of the lands on the circuit board.

15. The circuit board structure according to claim 14, wherein said insulating mask is formed of at least one member selected from the group consisting of a solder resist ink and a polyimide tape.

16. The circuit board structure according to claim 14 or 15, wherein the sizes of the exposed area of said solder ball lands increase gradually from a periphery of the circuit board to an inner area of the circuit board such that the exposed area of an outermost solder ball land has a smallest size, while the exposed are of an innermost solder ball land has a largest size.

17. The circuit board structure according to claim 14 or 15, wherein the sizes of the exposed area of said solder ball lands increases gradually from the inner area of the circuit board to the periphery of the circuit board such that an innermost solder ball land has a smallest size, while an outermost solder ball land has a largest size.

18. The circuit board structure according to claim 14, wherein said solder ball lands are formed of at least one member selected from the group consisting of gold, nickel and copper.

19. The circuit board structure according to claim 16, wherein said solder ball lands are formed of at least one member selected from the group consisting of gold, nickel and copper.

20. The circuit board structure according to claim 17, wherein said solder ball lands are formed of at least one member selected from the group consisting of gold, nickel and copper.

* * * * *